United States Patent [19]

Boudewijns

[11] Patent Number: 4,885,552
[45] Date of Patent: Dec. 5, 1989

[54] OSCILLATOR PHASE CONTROL LOOP HAVING PLURAL SWITCHED CURRENT SOURCES

[75] Inventor: Arnoldus J. J. Boudewijns, Eindhoven, Netherlands

[73] Assignee: U.S. Philips Corporation, New York, N.Y.

[21] Appl. No.: 253,784

[22] Filed: Oct. 5, 1988

[30] Foreign Application Priority Data

Oct. 12, 1987 [NL] Netherlands .......................... 8702424

[51] Int. Cl.$^4$ .......................... H03L 7/08; H03L 7/18
[52] U.S. Cl. .................................... 331/1 A; 331/14; 331/17; 331/27
[58] Field of Search .................. 331/1 A, 14, 17, 25, 331/27

[56] References Cited

U.S. PATENT DOCUMENTS 4,244,043  1/1981  Fujita et al. ...................... 331/25 X
4,774,479  9/1988  Tateishi .............................. 331/1 A Primary Examiner—Siegfried H. Grimm
Attorney, Agent, or Firm—Edward W. Goodman

[57] ABSTRACT

In a phase control loop of an oscillator circuit having an oscillator (1) whose frequency is dependent on a control current (81), an output signal is obtained from a phase detector (13) in the phase control loop and is applied to a switchable (23, 27) first current-source circuit (29) charging a capacitor (35) from which a control signal is obtained which is applied via a second current-source circuit (63) to a control signal input (81) of the oscillator (1). To render the operation of the circuit less dependent on the frequency of phase variations, the second current-source circuit is also switchable (69, 71) by the phase detector (13).

2 Claims, 1 Drawing Sheet

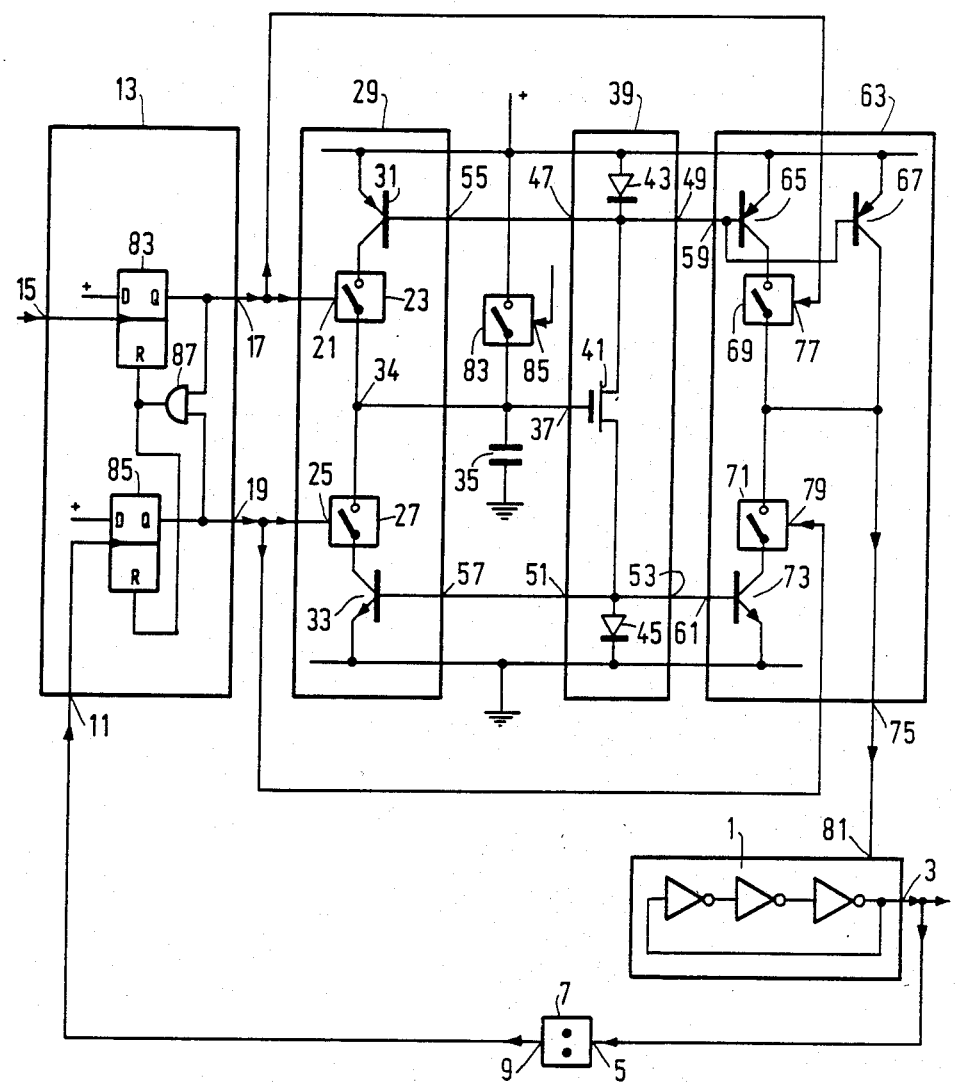

OSCILLATOR PHASE CONTROL LOOP HAVING PLURAL SWITCHED CURRENT SOURCES

BACKGROUND OF THE INVENTION

1. Field of the Invention

The invention relates to an oscillator circuit comprising a phase control loop including a phase detector which has a first input coupled to an output of an oscillator, a second input coupled to a comparison signal input of the phase control loop and an output circuit coupled to a current-source circuit which is switchable by means of the output circuit for controlling the charge of a capacitor from which a control signal for the oscillator is obtained.

2. Description of Related Art

An oscillator circuit of the type described above is known from U.S. Pat. No. 4,244,043.

Such an oscillator circuit may be used, for example as a clock signal generator for memory circuits in video signal processing circuits if the comparison signal is a line frequency signal and if the output of the oscillator is coupled via a frequency divider to the first input of the phase detector.

To improve the behavior of the phase control loop, for example FIG. 16 of the above cited United States patent proposes to arrange a resistor in series with the capacitor.

If the oscillator circuit is an integrated circuit, it is found to be difficult to choose a suitable value for this resistor.

The spreads in the gain of the phase detector, in the control slope of the oscillator and in the value of the resistor itself are such that in that case, the properties of the control loop are not fixed.

SUMMARY OF THE INVENTION

It is an object of the invention to provide a solution by which the properties of the control loop will be less dependent on the spread in the various elements of the circuit.

To this end an oscillator circuit of the type described in the opening paragraph is characterized in that the capacitor is connected to an input of a voltage-current converter with the aid of which a control current is obtained as a control signal for the oscillator, the frequency of the oscillator being dependent on the control current, and the control current being obtained via a second current-source circuit which is also switchable by means of the phase detector.

Since the resistor is no longer present, its value and spread in its value thus no longer have any influence.

To render the frequency characteristic of the phase control loop proportional to the comparison signal frequency, the oscillator circuit, according to a further embodiment of the invention, may also include a coupling circuit for obtaining a given ratio between the currents supplied by the first and the second current-source circuit.

BRIEF DESCRIPTION OF THE DRAWING

The invention will now be described in greater detail by way of example with reference to the accompanying drawing.

The drawing comprises a sole FIGURE showing a simplified diagram of an oscillator circuit according to the invention.

DESCRIPTION OF THE PREFERRED EMBODIMENTS

In the FIGURE an oscillator 1 has an output 3 which is connected to an input 5 of a frequency divider 7 an output 9 of which is connected to a first input 11 of a phase detector 13. A comparison signal, for example a signal at the line frequency of a television signal if the oscillator 1 must supply a signal which should serve as a clock signal for a memory or delay circuit for a video signal, for example a colour difference signal, is applied to a second input 15 of the phase detector 13.

The phase detector 13 includes an output circuit having a first output 17 and a second output 19 which are connected to a switching signal input 21 of a switch 23 and to a switching signal input 25 of a switch 27, respectively.

The switches 23 and 27 form part of a first switchable current-source circuit 29 and are arranged in series with each other and with two transistors 31, 33 between the terminals of a power supply source. A connection 34 between the switches 23 and 27 is connected to a terminal of a capacitor 35 which is also connected to a terminal of the power supply source and to an input 37 of a voltage-current converter 39.

The input 37 of the voltage-current converter 39 is connected to the gate electrode of a transistor 41, which is an N-channel field effect transistor in this case, and whose other electrodes are each connected via diodes 43, 45 to the power supply terminals. The junction points of these diodes with these electrodes constitute outputs 47, 49 and 51, 53, respectively, of the voltage-current converter 39. The outputs 47 and 51 are connected to inputs 55 and 57, respectively, of the first current-source circuit 29 which are, in turn, connected to the bases of the transistors 31 and 33, respectively, while the outputs 49 and 53 are connected to inputs 59 and 61, respectively, of a second current-source circuit 63.

The input 59 of the second current-source circuit 63 is connected to the bases of two transistors 65, 67 whose emitters are connected to the positive power supply terminal. The collector of the transistor 65 is connected via a series arrangement of two switches 69, 71 to the collector of the transistor 73 whose emitter is connected to the negative power supply terminal. The junction point of the switches 69 and 71 is connected to the collector of the transistor 67 and to an output 75 of the second current-source circuit 63. Switching signal inputs 77 and 79 of the switches 69 and 71 are connected to the outputs 17 and 19, respectively, of the phase detector 13.

The output 75 of the second current-source circuit 63 applies a control current to an input 81 of the oscillator 1 which oscillates at a frequency depending on the value of the control current. The current supplied by the transistor 67 determines the quiescent frequency of the oscillator 1.

The phase detector 13 is of a conventional type which is also used as a frequency detector and it comprises two D flip-flops whose D inputs are connected to a positive supply voltage and whose Q outputs are connected to the outputs 17 and 19, respectively, of the phase detector 13 and to the inputs of an AND gate 87 whose output is connected to the reset inputs of the D flip-flops 83, 85.

In the case of positive phase deviations of the comparison signal at the second input 15 with respect to the signal to be controlled in its phase, at the first input 11, the duration of the output pulses at the output 17 of the phase detector 13 is proportional to the phase deviation and the output 19 supplies very short-lasting pulses of a constant duration on the leading edges of the signal at the first input 11 of the phase detector 13, whereas in the case of negative phase deviations of the comparison signal at the second input 15, the duration of the output pulses at the output 19 of the phase detector 13 is proportional to the phase deviation and the output 17 supplies very short-lasting pulses of a constant duration. The pulses occur at the frequency of the signals at the first and the second input 11, 15 of the phase detector 13 if it operates as a phase detector, thus if the frequencies of the signals at the inputs are equal.

The current supplied by the transistor 67 determines a quiescent output current of the second current-source circuit 63, and therefore the quiescent frequency of the oscillator 1.

Due to the output signals of the phase detector 13, the switches 23 and 69 are closed in the case of a positive phase deviation at the frequency of the comparison signal during a period which is proportional to a positive phase deviation, and the switches 27 and 71 are closed during a constant, very short period at the same frequency. This results in the transistor 31 supplying a charge current for the capacitor 35 through the switch 23. Due to closing of the switch 69, a further current supplied by the transistor 65 is added to the quiescent current supplied by the transistor 67, so that the output current of the second current-source circuit 63 increases. In the case of a negative phase deviation, the switches 27 and 71 are closed at the frequency of the comparison signal during a period which is proportional to a negative phase deviation, and the switches 23, 69 are closed during a constant, very short period.

This results in the transistor 33 pulling a discharge current from the capacitor 35 through the switch 27. Due to the closing of the switch 71, a further current pulled by the transistor 73 is subtracted from the quiescent current supplied by the transistor 67, so that the output current of the second current-source circuit 63 decreases. If the voltage on the capacitor 35 increases, the gate voltage of the transistor 41 increases, so that a larger current flows through the transistor 41. This causes the voltages over the diodes 43 and 45 to increase. As can be seen in the drawing, the diode 43 and the transistors 31, 65 and 67 form, due to the coupling 55 and 59, a first current mirror, while the diode 45 and the transistors 33 and 73 form, due to the coupling 57 and 61, a second current mirror. If the voltages over the diodes 43 and 45 increase, the currents supplied by the transistors in the current mirrors increase too, which influences the operations of the first and second current-source circuits 29 and 63. The above applies inversely if the voltage on the capacitor 35 decreases. As is well known, there exists a given ratio between the currents supplied by the various transistors in a current mirror, so also between the currents supplied by the first and second current-source circuits 29 and 63.

The control loop constituted by the phase detector 13, the first current-source circuit 29, the capacitor 35, the voltage-current converter 39, the second current-source circuit 63 and the oscillator 1 will be set in such a way that a given phase deviation between the signals at the inputs 11 and 15 of the phase detector 13 is maintained. A given voltage drop across the capacitor 35 is associated therewith.

If the frequency of the comparison signal increases, the loop gain ordinarily would decrease at a constant value of the currents supplied by the transistors 31, 33. This effect is counteracted by the feedback of the voltage-current converter 39 to the transistors 31, 33 so that the loop gain is increased again, resulting in the ratio between the loop gain and the frequency of the comparison signal remaining substantially constant. This has the advantage that the value of the capacitor 35 need not be adapted to the frequency of the comparison signal.

In the oscillator circuits known until now, the function of a resistor in series with the capacitor is to increase the control current of the oscillator at a sudden phase increase of the comparison signal. This function is now fulfilled by the second current-source circuit 63.

Since the switches 69 and 71 are operated by the output signals of the phase detector 13, the control current caused by these switches at the output 75 of the second current-source circuit 63 is increased in the case of a sudden phase increase of the comparison signal at the second input 15 of the phase detector 13.

The described effects, which are due to the control of the transistors 31 and 33 and of the switches 69 and 71 are independent of the frequency of the comparison signal, because the influence of the operation of the switches 23, 27, 69, 71 on these effects only depends on the magnitude of the phase deviation and does not depend on the frequency of the comparison signal.

Since the first current-source circuit 29 and the second current-source circuit 63 do not supply current when the voltage across the capacitor 35 is zero, a switch 83 is provided for activating the control loop. This switch 83, when switching on an apparatus incorporating the oscillator circuit, receives a switching signal at its switching signal input 85 so that the switch 83 connects the capacitor 35 to the supply voltage for a short period.

It will be evident that the mere operation of the switches 69, 71 of the second current-source circuit 63 by the phase detector 13 has a favorable influence on the operation of the control loop so that, if desired, the coupling of the control of the first current-source circuit 29 to that of the second current-source circuit 63, due to the through-connection of their inputs 59 and 55, can be omitted and the transistors 31 and 33 can be adjusted to supply a constant current. The switch 83 can then also be dispensed with.

For the sake of clarity, the switches 23, 27, 69, 71, 83 are shown as mechanical switches, but they may of course be incorporated as semiconductor circuits in an integrated circuit.

The transistors 31, 33, 65, 73 shown as bipolar transistors for the sake of clarity and the elements 43, 45 shown as diodes may of course alternatively be unipolar semiconductor circuits.

The oscillator 1 is preferably in the form of a chain of inverters which may be equipped with unipolar semiconductors.

Examples of oscillators comprising a chain of CMOS inverters may be fund in Radio-Electronics, Vol. 58(1), January 1987, p. 65 et seq., and in applicant's co-pending U.S. patent application Ser. No. 07/203,048, filed June 2, 1988. The frequency of such oscillators is current dependent because if the drain-source current of the MOSFETs used increases, the conductance increases so that the output resistance decreases. If given (parasitic) capacitances are assumed, the RC-product of the output resistances of the inverters and these capacitances decreases, so that the oscillation frequency of the positively feedback coupled chain of CMOS inverters increases. The above applies inversely if the drain-source current of the MOSFETs used decreases.

What is claimed is:

1. An oscillator circuit comprising a phase control loop including a phase detector which has a first input coupled to an output of an oscillator, a second input coupled to a comparison signal input of the control loop, and an output circuit coupled to a current-source circuit which is switchable by means of said output circuit for controlling the charge of a capacitor from which a control signal for the oscillator is obtained, characterized in that the capacitor is connected to an input of a voltage-current converter with the aid of which a control current is obtained as a control signal for the oscillator, the frequency of the oscillator being dependent on said control current, and the control current being obtained via a second current-source circuit which is also switchable by means of the phase detector.

2. An oscillator circuit as claimed in claim 1, characterized in that it includes a coupling circuit for obtaining a given ratio between the currents supplied by the first current-source circuit and the second current-source circuit.

* * * * *